(12) United States Patent
Watanabe et al.

(10) Patent No.: US 9,196,819 B2
(45) Date of Patent: Nov. 24, 2015

(54) ORIENTED PIEZOELECTRIC CERAMIC, PIEZOELECTRIC ELEMENT, LIQUID DISCHARGE HEAD, ULTRASONIC MOTOR, AND DUST REMOVING DEVICE

(75) Inventors: Takayuki Watanabe, Yokohama (JP); Shunsuke Murakami, Kawasaki (JP); Nobuhiro Kumada, Kofu (JP)

(73) Assignees: Canon Kabushiki Kaisha, Tokyo (JP); University of Yamanashi, Kofu-shi (JP)

( * ) Notice: Subject to any disclaimer, the term of this patent is extended or adjusted under 35 U.S.C. 154(b) by 0 days.

(21) Appl. No.: 14/118,495

(22) PCT Filed: May 28, 2012

(86) PCT No.: PCT/JP2012/064340
§ 371 (c)(1),
(2), (4) Date: Nov. 18, 2013

(87) PCT Pub. No.: WO2012/165643
PCT Pub. Date: Dec. 6, 2012

(65) Prior Publication Data
US 2014/0152144 A1  Jun. 5, 2014

(30) Foreign Application Priority Data
May 31, 2011  (JP) .................................. 2011-121483

(51) Int. Cl.
*B41J 2/045* (2006.01)
*H01L 41/187* (2006.01)
(Continued)

(52) U.S. Cl.
CPC .......... *H01L 41/1871* (2013.01); *C04B 35/495* (2013.01); *H01L 41/1873* (2013.01);
(Continued)

(58) Field of Classification Search
None
See application file for complete search history.

(56) References Cited

U.S. PATENT DOCUMENTS

2006/0091588 A1    5/2006  Nakamura et al.
2011/0143146 A1*   6/2011  Harigai et al. ................ 428/446
(Continued)

FOREIGN PATENT DOCUMENTS

WO    WO 2010122707 A1 * 10/2010
WO       2012/165267 A1    12/2012

OTHER PUBLICATIONS

Sakamoto, W., Hamazaki, Y., Maiwa, H., Moriya, M., & Yogo, T. (n.d.). Lead-free piezoelectric thin films of Mn-doped NaNbO3—BaTiO3 fabricated by chemical solution deposition. Thin Solid Films, 4256-4260.*
(Continued)

*Primary Examiner* — Erica Lin
(74) *Attorney, Agent, or Firm* — Fitzpatrick, Cella, Harper & Scinto

(57) ABSTRACT

Provided is an oriented piezoelectric ceramic of satisfactory piezoelectricity, which includes a metal oxide represented by $(1-x)NaNbO_3-xBaTiO_3$. Also provided are a piezoelectric element using the oriented piezoelectric ceramic which includes the metal oxide represented by $(1-x)NaNbO_3-xBaTiO_3$, and a liquid discharge head, an ultrasonic motor, and a dust removing device which use the piezoelectric element. An oriented piezoelectric ceramic includes as a main component a metal oxide represented by the following general formula (1), in which the oriented piezoelectric ceramic has a lead content and a potassium content that are each 1,000 ppm or less: $(1-x)NaNbO_3-xBaTiO_3$ ... General formula (1), where a relationship of $0<x<0.3$ is satisfied.

7 Claims, 5 Drawing Sheets

(51) Int. Cl.
*C04B 35/495* (2006.01)
*H01L 41/43* (2013.01)

(52) U.S. Cl.
CPC . *C04B2235/3201* (2013.01); *C04B 2235/3215* (2013.01); *C04B 2235/3236* (2013.01); *C04B 2235/3281* (2013.01); *C04B 2235/5292* (2013.01); *C04B 2235/5296* (2013.01); *C04B 2235/6025* (2013.01); *C04B 2235/72* (2013.01); *C04B 2235/725* (2013.01); *C04B 2235/767* (2013.01); *C04B 2235/768* (2013.01); *C04B 2235/79* (2013.01); *H01L 41/43* (2013.01)

(56) References Cited

U.S. PATENT DOCUMENTS

2013/0335488 A1   12/2013   Watanabe et al.
2014/0106170 A1   4/2014    Watanabe et al.

OTHER PUBLICATIONS

K. Zhu et al., Effects of CUO Doping on Properties of NaNbO3—BaTiO3 Lead Free Piezoelectric Ceramics, 38(6), Journal of the Chinese Ceramic Society, 1031-1035 (Jun. 2010).*

Yasuyoshi Saito et al., "Lead-Free Piezoceramics," 432 Nature 84-87 (Oct. 2004).

Wataru Sakamoto et al., "Growth and Properties of Highly Oriented Lead-Free Mn-Doped NaNbO BaTiO Piezoelectric Thin Films Prepared by Chemical Solution Deposition" 318(1) J. Crystal Growth 879-883 (XP028164497).

J. T. Zeng et al., "Ferroelectric and Piezoelectric Properties of Na1—xBaxNb1—xTixO3 Ceramics," 89(9) J. Am. Ceramic Soc. 2828-2832 (Sep. 2006).

Satoshi Tanaka et al., "C-Axis Orientation of KSr2Nb5O15 Using a Rotating Magnetic Field," 90(11) J. Am. Ceramic Soc. 3503-3506 (Nov. 2007).

Lakhdar Gacem et al., "Crystal Growth and Dielectric Characterization of Crystals Derived from the Solid-Solution Ba (1-x)NaxTi(1-x)NbxO3 (BTNN)," 44(12) Materials Research Bulletin 2240-2245 (Aug. 2009) (XP026743194).

K. Zhu et al., "Effects of CuO Dopping on Properties of NaNbO3—BaTiO3 Lead-Free Piezoelectric Ceramics" 38(6) Journal of the Chinese Ceramic Society 1031-1035 (Jun. 2010) (XP009159678).

H.Y. Tian et al, "The effects of CuO-Doping on Dielectric and Piezoelectric Properties of Bi0.5TiO3-Ba(Zr, Ti)O3 Lead-Free Ceramics" 42(23) J. Mater. Sci. 9750-9755 (Aug. 2007) (XP019529037).

Office Action in Chinese Application No. 201280026294.4 (dated Jul. 16, 2014).

Wataru Sakamoto et al., "Growth and Properties of Highly Oriented Lead-Free Mn-Doped NaNbO BaTiO Piezoelectric Thin Films Prepared by Chemical Solution Deposition" 318(1) J. Crystal Growth 879-883 (Nov. 2010).

Examination Report in European Application No. 12726908.2 (dated Dec. 5, 2014).

Notice of Preliminary Rejection in Korean Application No. 10-2013-7033937 (mailed Mar. 17, 2015).

Notification of Reason for Rejection in Japanese Application No. 2011-121483 (dispatched Jul. 2, 2015).

Communication under Rule 71(3) EPC in European Application No. 12726908.2 (dated Sep. 14, 2015).

* cited by examiner

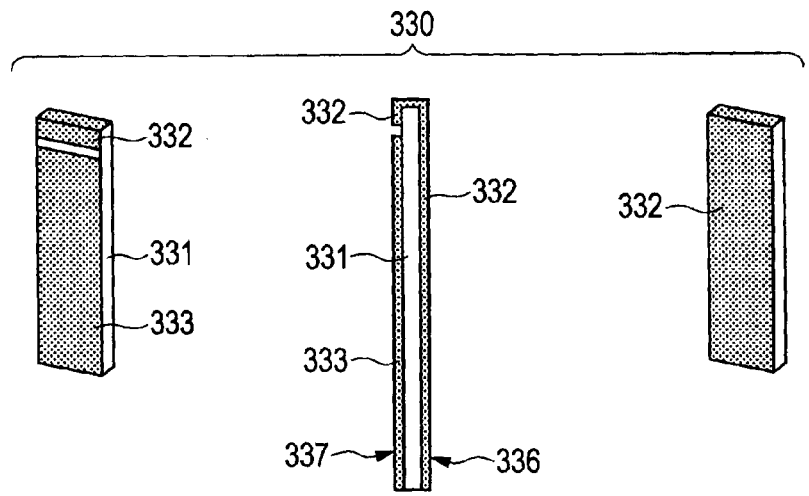
*FIG. 4A*    *FIG. 4B*    *FIG. 4C*
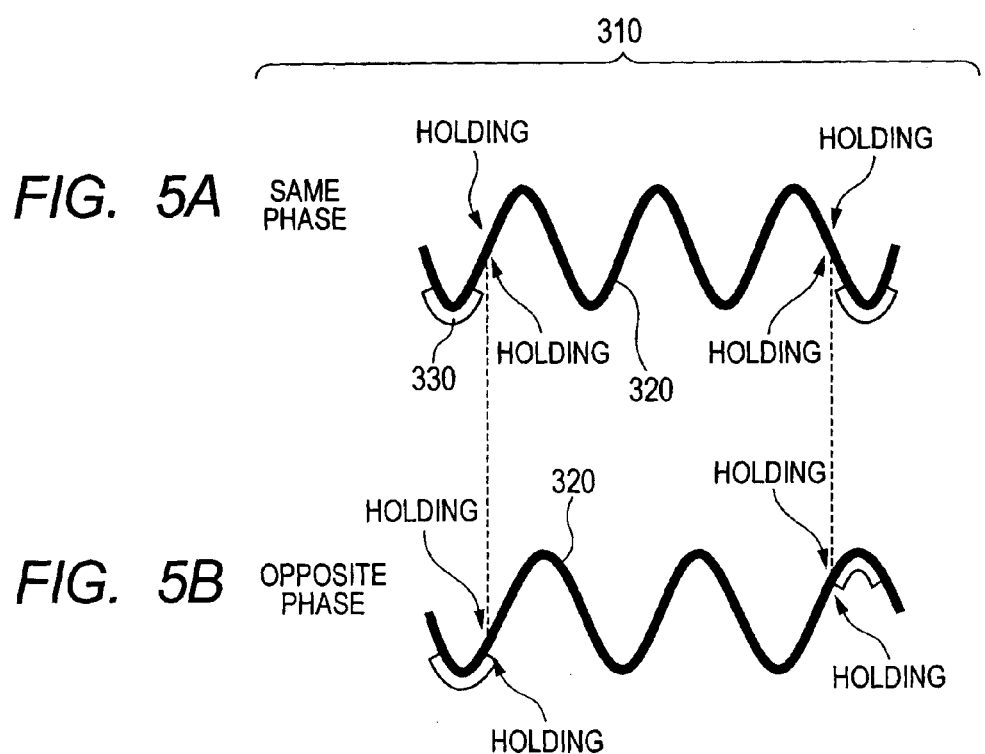
*FIG. 5A*  SAME PHASE
*FIG. 5B*  OPPOSITE PHASE

ORIENTED PIEZOELECTRIC CERAMIC, PIEZOELECTRIC ELEMENT, LIQUID DISCHARGE HEAD, ULTRASONIC MOTOR, AND DUST REMOVING DEVICE

TECHNICAL FIELD

The present invention relates to a piezoelectric material, and more particularly, to an oriented ceramic including a lead-free piezoelectric material. The present invention also relates to a piezoelectric element, a liquid discharge head, an ultrasonic motor, and a dust removing device, which use the piezoelectric material.

BACKGROUND ART

In Non Patent Literature 1, plate-like sodium niobate (general formula: $NaNbO_3$, hereinafter, referred to as NN) grains formed by topochemical micro-crystal conversion (hereinafter, referred to as TMC) is used to control the crystallographic orientation of a piezoelectric ceramic including potassium sodium niobate as a main component. Non Patent Literature 1 reports that the piezoelectricity of the piezoelectric ceramic with a preferred crystal orientation is greatly improved compared with that of a non-oriented ceramic.

Non Patent Literature 2 reports that a solid solution of NN and barium titanate, $\{(1-x)NaNbO_3\text{-}xBaTiO_3, 0<x<0.2\}$, is a promising lead-free piezoelectric material having a high Curie temperature. The solid solution of NN and barium titanate is hereinafter referred to as NN—BT.

Non Patent Literature 3 reports that, through casting in a high magnetic field, the orientation of a piezoelectric ceramic can be controlled.

CITATION LIST

Non Patent Literature

NPL 1: "Nature", Y. Saito et. al., 2004, Volume 432, pp. 84-87
NPL 2: "Journal of the American Ceramic Society", J. T. Zeng et. al., 2006, Volume 89, pp. 2828-2832
NPL 3: "Journal of the American Ceramic Society", S. Tanaka et. al., 2007, Volume 90, pp. 3503-3506

SUMMARY OF INVENTION

Technical Problems

The piezoelectricity of an NN—BT piezoelectric ceramic is thought to be improved by controlling the crystallographic orientation thereof. However, there have been no reports of an oriented NN—BT ceramic.

In a method of forming plate-like grains by TMC, it is difficult to complete ion exchange reaction to leave no impurities. Therefore, if the method is applied to NN—BT, impurities such as potassium may be mixed into the ceramic to deteriorate the characteristics. Accordingly, it is difficult to use plate-like grains by TMC for controlling the orientation of NN—BT.

Further, the inventor diligently made a study and found that NN—BT exhibited low sensitivity to a magnetic field and, even with use of a magnetic field of an intensity which was usable at present, to control the crystallographic orientation of NN—BT was difficult.

The present invention has been made to solve the above-mentioned problems, and an object of the present invention is to provide an NN—BT oriented piezoelectric ceramic of satisfactory piezoelectricity which does not contain an impurity component such as potassium or lead. Another object of the present invention is to provide a piezoelectric element using the oriented NN—BT piezoelectric ceramic, and a liquid discharge head, an ultrasonic motor, and a dust removing device which use the piezoelectric element.

Solution to Problems

In order to solve the above-mentioned problems, according to a first aspect of the present invention, there is provided an oriented piezoelectric ceramic, including a metal oxide represented by the following general formula (1) as a main component. The oriented piezoelectric ceramic contains 1,000 ppm or less lead and potassium:

$$(1-x)NaNbO_3\text{-}xBaTiO_3 \qquad \text{General formula (1)},$$

where a relationship of $0<x<0.3$ is satisfied.

According to a second aspect of the present invention, there is provided a piezoelectric element, including a first electrode, a piezoelectric material, and a second electrode, in which the piezoelectric material is the oriented piezoelectric ceramic according to the present invention.

According to a third aspect of the present invention, there is provided a liquid discharge head, including: a liquid chamber including a vibration portion including the above-mentioned piezoelectric element; and a discharge port communicating to the liquid chamber.

According to a fourth aspect of the present invention, there is provided an ultrasonic motor, including: a vibration body including the above-mentioned piezoelectric element; and a moving body that is in contact with the vibration body.

According to a fifth aspect of the present invention, there is provided a dust removing device, including a vibration body including the above-mentioned piezoelectric element.

Advantageous Effects of Invention

According to the present invention, it is possible to provide the oriented piezoelectric ceramic which does not contain lead or potassium, has a higher Curie temperature than that of barium titanate, and has a satisfactory piezoelectricity. The piezoelectric material according to the present invention does not use lead, and thus, the environmental load thereof is extremely low. Further, the piezoelectric material according to the present invention does not use potassium, and thus, is excellent in sintering performance and in resistance to humidity.

Further features of the present invention will become apparent from the following description of exemplary embodiments with reference to the attached drawings.

BRIEF DESCRIPTION OF DRAWINGS

FIGS. 4A, 4B, and 4C are schematic diagrams illustrating electrodes of the dust removing device according to the embodiment of the present invention.

FIGS. 5A and 5B are schematic diagrams illustrating the principle of vibration of the dust removing device according to the embodiment of the present invention.

DESCRIPTION OF EMBODIMENTS

Figure 1A:
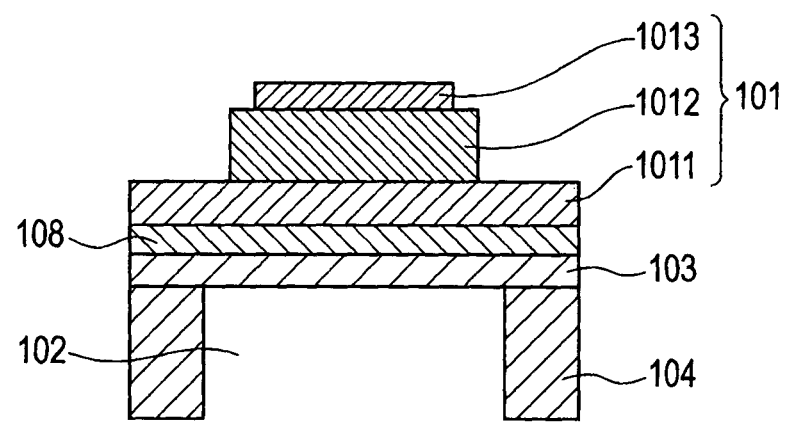
FIGS. 1A and 1B are schematic diagrams illustrating a structure of a liquid discharge head according to an embodiment of the present invention.

Embodiments for carrying out the present invention are described in the following.

The present invention provides a lead-free oriented piezoelectric ceramic which is based on NN—BT as a main component and which has satisfactory piezoelectric property and insulation property. Note that, the piezoelectric material of the present invention may be used in various applications such as a capacitor, a memory, and a sensor, utilizing its characteristics as a dielectric.

The oriented piezoelectric ceramic according to the present invention is a polycrystal which consists of fine polycrystalline grains or single crystalline grains, and is not a so-called single crystal which macroscopically has a three-dimensional crystallographic orientation. The crystallographic axes of crystals in the oriented piezoelectric ceramic are oriented along a certain axis, and there is no crystallographic orientation in a direction perpendicular to the axis.

According to the present invention, there is provided an oriented piezoelectric ceramic, including a metal oxide represented by the following general formula (1) as a main component.

The oriented piezoelectric ceramic contains 1,000 ppm or less lead and potassium:

$$(1-x)NaNbO_3-xBaTiO_3 \quad \text{General formula (1)},$$

where a relationship of $0<x<0.3$ is satisfied.

The oriented piezoelectric ceramic means that the degree of orientation thereof evaluated by the Lotgering factor is 10% or more.

The Lotgering factor is calculated according to Equation 2 using peak intensity of an X-ray diffracted from a target crystal plane:

$$F=(\rho-\rho_0)/(1-\rho_0) \quad \text{(Equation 2)},$$

where $\rho_0$ is calculated using X-ray diffraction intensity ($I_0$) of a non-oriented sample. In the case of a (001) oriented tetragonal crystal, $\rho 0$ is determined according to Equation 3 as a ratio of the sum of the intensities of a 001 diffractions to the sum of all the diffraction intensities:

$$\rho_0=\Sigma I_0(001)/\Sigma I_0(hkl) \quad \text{(Equation 3)},$$

where h, k, and l are integers.

$\rho$ is calculated using X-ray diffraction intensity (I) of an oriented sample. In the case of a (001) oriented tetragonal crystal, $\rho$ is determined according to Equation 4 as a ratio of the sum of the intensities of a 001 diffractions to the sum of all the diffraction intensities, similarly to the case of the above Equation 3:

$$\rho=\Sigma I(001)/\Sigma I(hkl) \quad \text{(Equation 4)}.$$

Containing NN—BT as a main component means that the NN—BT component occupies 90% or more of all the components of the oriented piezoelectric ceramic.

NN is an antiferroelectric crystal, and thus, in order to use NN as a piezoelectric material, it is necessary to dissolve $BaTiO_3$ in the solid. It follows that $0<x$ needs to be satisfied.

If the amount of the solid solution of $BaTiO_3$ exceeds $x=0.3$, the Curie temperature of the solid solution is equal to or lower than 57° C., which makes difficult the industrial application thereof. Therefore, $0<x<0.3$ needs to be satisfied. It is preferred that $0.05 \leq x \leq 0.15$ be satisfied, with which high piezoelectricity is obtained. Further, if $0.1 \leq x \leq 0.15$ is satisfied, then the Curie temperature is approximately in a range of 160° C. to 240° C. and polarization treatment is easy, which is preferred. Further, if $0.1 \leq x \leq 0.12$ is satisfied, then the Curie temperature is approximately in a range of 190° C. to 240° C. and, not only polarization treatment is easy, but also thermal degradation in a device manufacturing process is reduced, which is further preferred.

Herein, the Curie temperature refers to not only the Curie temperature estimated according to the Curie-Weiss law but also a temperature at which the dielectric constant becomes a local maximum in the vicinity of a phase transition temperature between a ferroelectric phase and a paraelectric phase (cubic).

When NN or a crystal containing NN as a component is sintered, sodium may sometimes be vaporized or diffused and the composition of the sample after the sintering becomes deficient in sodium with respect to niobium. Specifically, a defect may occur at the A site. The general formula (1) allows a small deviation from a stoichiometric ratio due to such a process, weighing, the purity of a material to be used, moisture absorption of a material, or the like. For example, a deviation of the composition of ±5% or less from the stoichiometric ratio is allowed.

The oriented piezoelectric ceramic according to the present invention does not contain more than 1,000 ppm of lead and does not contain more than 1,000 ppm of potassium. If the lead content is equal to 1,000 ppm or less, even if a product using the oriented piezoelectric ceramic according to the present invention is scrapped and exposed to a severe environment, it is less likely that lead in the product adversely affects the environment. Further, if the potassium content is equal to 1,000 ppm or less, it is less likely that the performance of the oriented piezoelectric ceramic is lowered by moisture absorption.

For the purpose of facilitating manufacture of the oriented piezoelectric ceramic according to the present invention and adjusting the physical properties of the oriented piezoelectric ceramic according to the present invention, part of barium may be substituted by a divalent metallic element, for example, strontium or calcium. Similarly, part of niobium may be substituted by a pentavalent metallic element, for example, tantalum or vanadium.

(100) orientation in a pseudocubic notation is preferred for the oriented piezoelectric ceramic.

With regard to the crystal system of NN—BT, depending on the composition, NN—BT belongs to any one or multiple of monoclinic, orthorhombic, tetragonal, and cubic systems at the same time. However, for the sake of simple representation, NN—BT is herein regarded to belong to the pseudocubic system unless otherwise specified.

When NN—BT is an orthorhombic ferroelectric, the spontaneous polarization axis thereof is in parallel to the [101] direction. Therefore, when an electric field is applied in the [001] direction of the crystal, an engineered domain structure is formed in the crystal to improve the piezoelectricity. When the crystal is a tetragonal ferroelectric, the spontaneous polarization axis thereof is in parallel to the [001] direction. Therefore, when an electric field is applied in the [001] direction of the crystal, the spontaneous polarization in parallel to the electric field is easily reversed to improve the piezoelectricity. Therefore, it is preferred that the oriented piezoelectric ceramic be (100) oriented.

It is preferred that the degree of orientation evaluated by the Lotgering factor of the oriented piezoelectric ceramic be 50% or more. The reason is that, if the Lotgering factor is 30% or more, the piezoelectricity is higher than that of a non-oriented ceramic. More preferably, the degree of orientation is 40% or more. The reason is that higher piezoelectricity is exhibited than in a case of a sample having the Lotgering factor of 30%.

It is preferred that the oriented piezoelectric ceramic contain 0.05 mol % or more and 2 mol % or less of copper in terms of metal with respect to 1 mol of a metal oxide represented by the above-mentioned general formula (1): $(1-x)NaNbO_3$-$xBaTiO_3$ (where $0<x<0.3$). When the oriented piezoelectric ceramic contain copper, insulation property of the oriented piezoelectric ceramic is improved. Further, the amount of defects in the crystal is reduced to facilitate polarization switching. Facilitating polarization switching means any one of that the coercive field of the ferroelectric is reduced and that the amount of polarization switching which occurs when a certain level of voltage in the shape of a triangular wave is applied increases. There is also an effect of lowering the sintering temperature.

When the amount of copper added is less than 0.05 mol %, sufficient effects cannot be obtained. When the added amount exceeds 2 mol %, the piezoelectricity is lowered. Therefore, it is preferred that the amount of copper added be 0.05 mol % or more and 2 mol % or less.

Hereinafter, a piezoelectric element using the piezoelectric material of the present invention is described.

The piezoelectric element according to the present invention is a piezoelectric element including at least a first electrode, a piezoelectric material, and a second electrode, and the piezoelectric material is the above-mentioned piezoelectric material.

The first electrode and the second electrode are each formed of a conductive layer having a thickness of about 5 nm to 2,000 nm. The material for the conductive layer is not particularly limited, and may be a material which is typically used in a piezoelectric element. Examples of such material include metals such as Ti, Pt, Ta, Ir, Sr, In, Sn, Au, Al, Fe, Cr, Ni, Pd, Ag, and Cu, and oxides of these metals. Each of the first electrode and the second electrode may be formed of one kind of those materials, or may be obtained by laminating two or more kinds thereof. The first electrode and the second electrode may be formed of different materials.

A manufacturing method for the first electrode and the second electrode is not limited. The first electrode and the second electrode may be formed by baking a metal paste or by sputtering, vapor deposition, or the like. In addition, both the first electrode and the second electrode may be patterned in desired shapes for use.

Figure 1B:
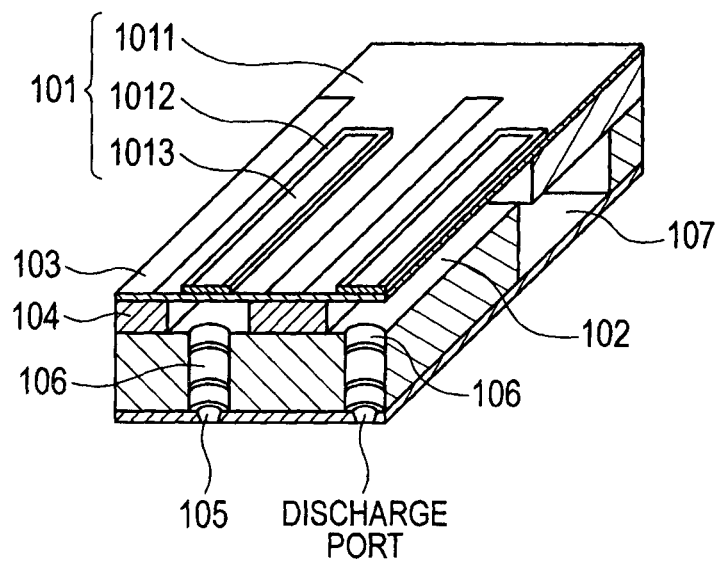

FIGS. 1A and 1B are schematic views illustrating a structure of a liquid discharge head according to an embodiment of the present invention. As illustrated in FIGS. 1A and 1B, the liquid discharge head of the present invention is a liquid discharge head including a piezoelectric element 101 of the present invention. The piezoelectric element 101 is a piezoelectric element including at least a first electrode 1011, a piezoelectric material 1012, and a second electrode 1013. The piezoelectric material 1012 is patterned as required as illustrated in FIG. 1B.

FIG. 1B is a schematic view of the liquid discharge head. The liquid discharge head includes discharge ports 105, individual liquid chambers 102, communicating holes 106 for connecting the individual liquid chambers 102 and the discharge ports 105, liquid chamber partition walls 104, a common liquid chamber 107, a diaphragm 103, and the piezoelectric elements 101. Each of the piezoelectric elements 101, which has a rectangular shape in FIG. 1B, may have a shape except the rectangular shape such as an elliptical shape, a circular shape, or a parallelogram shape. In general, the piezoelectric material 1012 has a shape in conformity with the shape of the individual liquid chamber 102.

The vicinity of the piezoelectric element 101 included in the liquid discharge head of the present invention is described in detail with reference to FIG. 1A. FIG. 1A is a sectional view of the piezoelectric element in the width direction of the liquid discharge head illustrated in FIG. 1B. The sectional shape of the piezoelectric element 101, which is illustrated in a rectangular shape, may be a trapezoidal shape or a reverse trapezoidal shape.

In FIG. 1A, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 as a vibration portion and the lower electrode.

Note that, those differences in name depend on a manufacturing method for the device and an effect of the present invention can be obtained in any case.

In the liquid discharge head, the diaphragm 103 vertically fluctuates owing to the expansion and contraction of the piezoelectric material 1012 to apply a pressure to liquid in the individual liquid chamber 102. As a result, the liquid is discharged from the discharge port 105. The liquid discharge head of the present invention can be used in a printer application or the manufacture of an electronic device.

The diaphragm 103 has a thickness of 1.0 µm or more and 15 µm or less, preferably 1.5 µm or more and 8 µm or less. A material for the diaphragm, which is not limited, is preferably Si. Si for the diaphragm may be doped with boron or phosphorous. In addition, the buffer layer and the electrode layer on the diaphragm may serve as part of the diaphragm.

The buffer layer 108 has a thickness of 5 nm or more and 300 nm or less, preferably 10 nm or more and 200 nm or less. A material for the buffer layer 108, which is not limited, is preferably $SiO_2$.

The size of the discharge port 105 is 5 µm or more and 40 µm or less in terms of an equivalent circular diameter. The shape of the discharge port 105 may be a circular shape, or may be a star shape, a square shape, or a triangular shape.

Next, an ultrasonic motor using the piezoelectric element of the present invention is described.

Figure 2A:
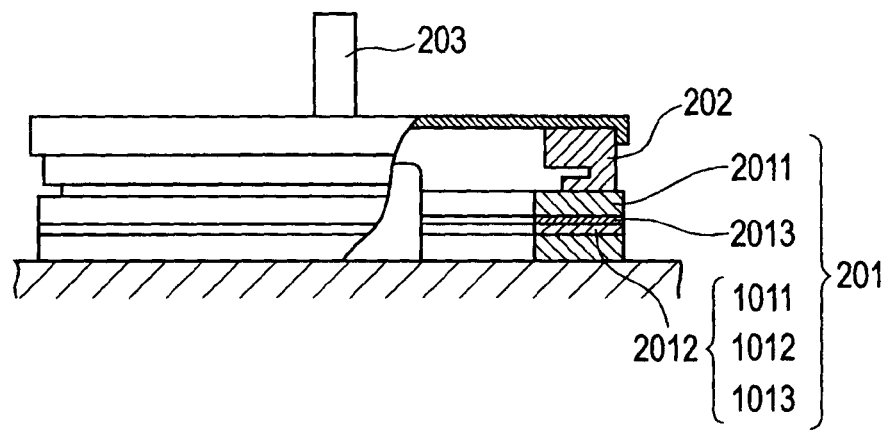
FIGS. 2A and 2B are schematic diagrams illustrating a structure of an ultrasonic motor according to an embodiment of the present invention.
Figure 2B:
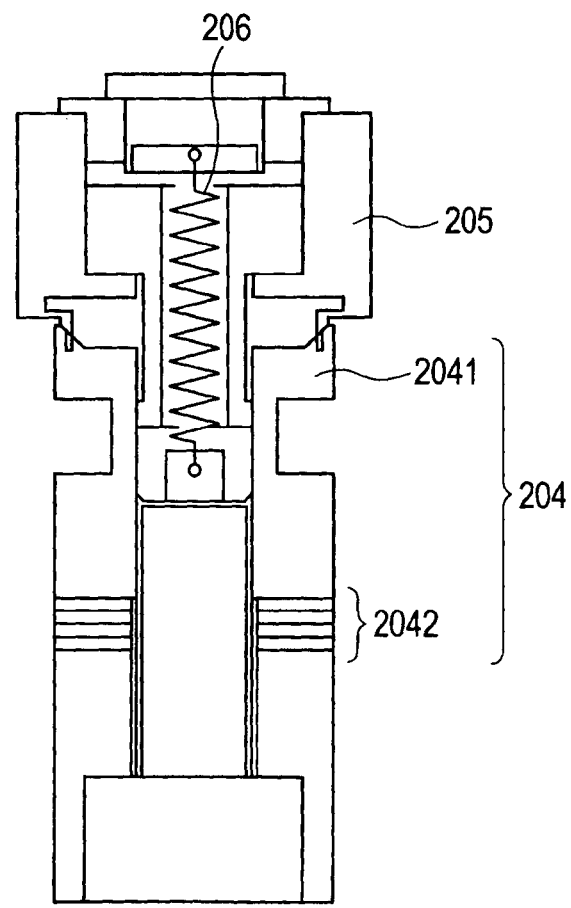

FIGS. 2A and 2B are schematic views illustrating a structure of the ultrasonic motor according to an embodiment of the present invention.

FIG. 2A illustrates an ultrasonic motor in which the piezoelectric element of the present invention is formed of a single plate. The ultrasonic motor includes a transducer 201 as a vibration body, a rotor 202 as a moving body, which is brought into contact with the sliding surface of the transducer 201 by virtue of a pressure applied from a pressurizing spring (not shown), and an output axis 203 provided so as to be integral with the rotor 202. The transducer 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive). The piezoelectric element 2012 of the present invention is formed of a piezoelectric material interposed between a first electrode (not shown) and a second electrode (not shown).

The application of two alternating voltages different from each other in phase by $\pi/2$ to the piezoelectric element of the present invention results in the generation of a bending travelling wave in the transducer 201, and hence each point on the sliding surface of the transducer 201 undergoes an elliptical motion. When the rotor 202 is brought into press contact with the sliding surface of the transducer 201, the rotor 202 receives a frictional force from the transducer 201 to rotate in the direction opposite to the bending travelling wave. A body to be driven (not shown) is joined to the output axis 203, and is driven by the rotary force of the rotor 202.

The application of a voltage to the piezoelectric material results in the expansion and contraction of the piezoelectric material due to a piezoelectric transverse effect. When an elastic body such as a metal is joined to the piezoelectric element, the elastic body is bent by the expansion and contraction of the piezoelectric material. The ultrasonic motor of the kind described here utilizes the principle.

Next, an ultrasonic motor including a piezoelectric element having a stack structure is described with reference to FIG. 2B. A transducer 204 is formed of a stacked piezoelectric element 2042 interposed between tubular metal elastic bodies 2041. The stacked piezoelectric element 2042 is an element formed of multiple stacked piezoelectric materials (not shown), and includes a first electrode and a second electrode on its outer surface of lamination, and inner electrodes on its inner surface of lamination. The metal elastic bodies 2041 are fastened with bolts so that the piezoelectric element 2042 may be interposed between and fixed by the bodies. Thus, the transducer 204 is formed.

The application of alternating voltages different from each other in phase to the piezoelectric element 2042 causes the transducer 204 to excite two vibrations orthogonal to each other. The two vibrations are combined to form a circular vibration for driving the tip portion of the transducer 204. Note that, a constricted circumferential groove is formed in the upper portion of the transducer 204 to enlarge the displacement of the vibration for driving.

A rotor 205 is brought into contact with the transducer 204 under a pressure from a spring 206 for pressurization to obtain a frictional force for driving. The rotor 205 is rotatably supported by a bearing.

Next, a dust removing device using the piezoelectric element of the present invention is described.

Figure 3A:
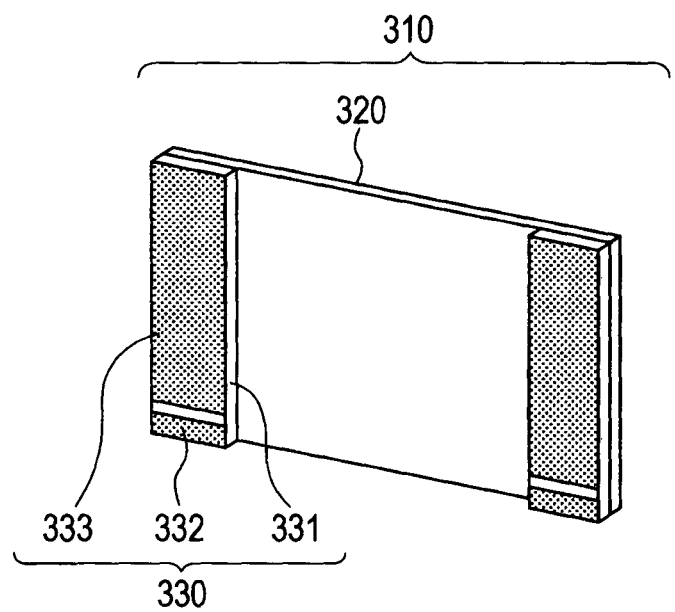
FIGS. 3A and 3B are schematic diagrams illustrating a structure of a dust removing device according to an embodiment of the present invention.
Figure 3B:
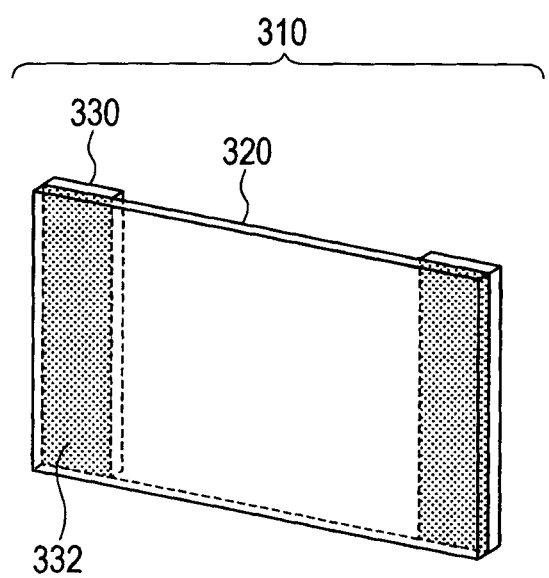

FIGS. 3A and 3B are schematic diagrams illustrating a structure of the dust removing device according to an embodiment of the present invention. A dust removing device 310 includes a plate-like piezoelectric element 330 and a diaphragm 320. The material of the diaphragm 320 as a vibration body is not limited. In the case where the dust removing device 310 is used for an optical device, a transparent material or a reflective material can be used as the material of the diaphragm 320.

FIGS. 4A to 4C are schematic diagrams illustrating a structure of the piezoelectric element 330 illustrated in FIGS. 3A and 3B. FIGS. 4A and 4C illustrate a front surface structure and a rear surface structure of the piezoelectric element 330, respectively. FIG. 4B illustrates a side surface structure. As illustrated in FIGS. 4A to 4C, the piezoelectric element 330 includes a piezoelectric material 331, a first electrode 332, and a second electrode 333. The first electrode 332 and the second electrode 333 are disposed so as to be opposed to the plate surfaces of the piezoelectric material 331. In FIG. 4C, the front surface of the piezoelectric element 330 on which the first electrode 332 is disposed is referred to as a first electrode surface 336. In FIG. 4A, the front surface of the piezoelectric element 330 on which the second electrode 333 is disposed is referred to as a second electrode surface 337.

The electrode surface as used in the present invention refers to a surface of the piezoelectric element on which the electrode is disposed. For instance, as illustrated in FIGS. 4A to 4C, the first electrode 332 may extend around to the second electrode surface 337.

As illustrated in FIGS. 3A and 3B, as for the piezoelectric element 330 and the diaphragm 320, the plate surface of the diaphragm 320 is fixed to the first electrode surface 336 of the piezoelectric element 330. When the piezoelectric element 330 is driven, a stress is generated between the piezoelectric element 330 and the diaphragm 320 so that out-of-plane vibration is generated in the diaphragm. The dust removing device 310 of the present invention is a device that removes foreign matters such as dust sticking to the surface of the diaphragm 320 by the out-of-plane vibration of the diaphragm 320. The out-of-plane vibration means elastic vibration in which the diaphragm moves in the optical axis direction, namely in the thickness direction of the diaphragm.

FIGS. 5A and 5B are schematic diagrams illustrating a vibration principle of the dust removing device 310 of the present invention. FIG. 5A illustrates a state in which alternating electric fields having the same phase are applied to a pair of left and right piezoelectric elements 330 so that the out-of-plane vibration is generated in the diaphragm 320. The polarization direction of the piezoelectric material forming the pair of left and right piezoelectric elements 330 is the same as the thickness direction of the piezoelectric elements 330, and the dust removing device 310 is driven by the seventh vibrational mode. FIG. 5B illustrates a state in which alternating voltages having opposite phases by 180° are applied to the pair of left and right piezoelectric elements 330 so that the out-of-plane vibration is generated in the diaphragm 320. The dust removing device 310 is driven by the sixth vibrational mode. The dust removing device 310 of the present invention is a device that can effectively remove dust sticking to the surface of the diaphragm by using at least two vibrational modes selectively.

As described above, the piezoelectric element of the present invention is suitably applicable to the liquid discharge head, the ultrasonic motor, and the dust removing device.

Through the use of the oriented piezoelectric ceramic represented by the general formula (1) of the present invention, it is possible to provide the liquid discharge head having nozzle density and discharge capacity which are the same as or higher than those in a case where a piezoelectric material that contains lead is used.

Through the use of the oriented piezoelectric ceramic represented by the general formula (1) of the present invention, it is possible to provide the ultrasonic motor having driving force and durability which are the same as or higher than those in a case where a piezoelectric material that contains lead is used.

Through the use of the oriented piezoelectric ceramic represented by the general formula (1) of the present invention, it is possible to provide the dust removing device having dust-removing efficiency which is the same as or higher than that in a case where a piezoelectric material that contains lead is used.

The oriented piezoelectric ceramic of the present invention can be used in such a device as an ultrasonic transducer, a piezoelectric actuator, a piezoelectric sensor, and a ferroelectric memory, as well as the liquid discharge head and the motor.

EXAMPLES

Hereinafter, the piezoelectric material of the present invention is described more specifically by way of examples. However, the present invention is not limited by the following examples.

Comparative Example 1

NaNbO$_3$ powder formed by a solid state reaction and BaTiO$_3$ powder (manufactured by Sakai Chemical Industry Co., Ltd.) were mixed to form 0.88NaNbO$_3$-0.12BaTiO$_3$. Calcining was carried out at 900 to 1,100° C. for six hours in the air. After the calcined powder was crushed, PVB of 3 wt % was added to carry out granulation. The granulated powder was filled in a mold for press forming. When the granulated powder was filled, the mold for press forming was tapped with a hand. After that, the mixed powder was uniaxially pressurized at 200 MPa to form a disc-like compact having a diameter of 17 mm and a thickness of 1 to 2 mm. The compact was held at 600° C. for 3 hours in the air to remove the binder, and then, heating to 1,260° C. was carried out and the state was held for 6 hours to obtain a sintered body.

After the sintering, evaluation was made by X-ray diffraction of the sample. It was found that the sample had a single-phase perovskite structure and that there was no preferred orientation of the crystal.

The pellets were crashed in a mortar in order to obtain an X-ray diffraction chart of a non-oriented case. Through comparison with this chart, it could be determined whether or not there is a preferred orientation in the obtained ceramic. As additional methods for confirming the preferred orientation, two X-ray diffraction techniques are available. One is a $\chi$ (sample tilt angle) scan measurement and the other is a pole figure measurement. Both measurements are performed with a fixed 2θ angle to a specific diffraction plane of NN—BT. In any of these cases, if the sample does not have a preferred orientation, no angle $\chi$ is observed at which the diffraction intensity becomes a maximum.

The obtained non-oriented ceramic was ground until the thickness became 500 μm. Through annealing of the sample at 450° C. for 1 hour in the air, organic matters on the surface were removed. After that, titanium at a thickness of 3 nm as an adhesive layer was formed on both an upper surface and a lower surface by DC sputtering. Gold as an electrode layer was formed thereon at a thickness of 300 nm. The piezoelectric material with the electrodes were cut into pieces each sized to be 2.5 mm×10 mm. Through the process described above, a strip-like piezoelectric ceramic sample piece was obtained. The strip-like sample was put in silicone oil and polarization treatment was carried out. After the sample was heated to 150° C. in the silicone oil, a direct-current voltage of 30 kV/cm was applied thereto for 30 minutes, which was followed by cooling to room temperature with the electric field remaining applied thereto, and then the application of the electric field was stopped. A piezoelectric constant d$_{31}$ of the piezoelectric ceramic was evaluated by the resonance-antiresonance method to be 40 to 50 pC/N.

Figure 6A:
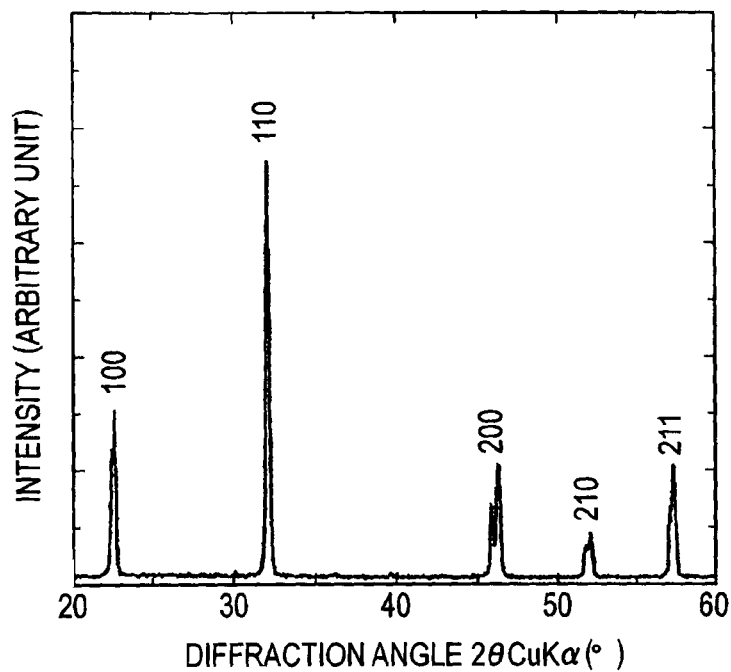
FIG. 6A shows an X-ray diffraction pattern of a non-oriented piezoelectric ceramic of Comparative Example 1 of the present invention and FIG. 6B shows an X-ray diffraction pattern of an oriented piezoelectric ceramic of Example 1 of the present invention.

FIG. 6A shows an X-ray diffraction pattern of the non-oriented piezoelectric ceramic obtained in Comparative Example 1.

Example 1

10 g of Nb$_2$O$_5$ (manufactured by KANTO CHEMICAL CO., INC.) and 52 g of K$_2$CO$_3$ (manufactured by KANTO CHEMICAL CO., INC.) were mixed to form mixed powder. A platinum crucible was used to hold the mixed powder at 950° C. for 1 hour in the air to melt the mixed powder. After 1 hour passed, the mixed powder was rapidly cooled. The obtained white mass was dissolved in 500 ml of water. After that, 7 micron filter paper was used to filter out insoluble matters. 200 ml of HNO$_3$ (manufactured by KANTO CHEMICAL CO., INC.) and 300 ml of water were gradually added to the sample obtained after the insoluble matters were removed. White powder precipitated. The precipitate was collected with filter paper and washed with water. The collected matter was dried at 50° C.

The sample obtained by this method was an amorphous niobium oxide hydrate, the material of which is represented by the following general formula (5):

Nb$_2$O$_5$.$n$H2O(1<$n$<3)   General formula (5)

However, the niobium oxide hydrate may be, other than Nb$_2$O$_5$.nH$_2$O, Nb$_2$O$_4$(OH)$_2$.nH$_2$O, Nb$_2$O$_3$(OH)$_4$.nH$_2$O, or a mixture thereof. The amorphous niobium oxide hydrate is herein simply represented by the general formula (5).

A certain niobium oxide hydrate was heated in order to determine n in the general formula (5) by the weight change. The result was n=1.5.

Then, the obtained niobium oxide hydrate was used as a raw material and NN powder was hydrothermally synthesized.

1 g of the niobium oxide hydrate and 50 ml of an aqueous solution of sodium hydroxide at a concentration of 4 M were put in an autoclave having an inner jacket formed of Teflon (registered trademark) and having a capacity of 70 ml. The autoclave was sealed, held at 180° C. for 24 hours, and then slowly cooled to room temperature. During the time when the autoclave was held at a high temperature, the pressure in the autoclave was 1 atm or more. The content which was taken out of the autoclave was filtered out to extract the product. The obtained sample was cleaned with distilled water, and then dried at 50° C. The constituent phase of the obtained sample was determined using X-ray diffraction, the shape and the average length of the respective sides of the obtained sample were measured with a scanning electron microscope, and the composition of the obtained sample was measured with ICP.

The X-ray diffraction revealed that the obtained grains were orthorhombic single-phase NaNbO$_3$. Observation with the microscope revealed that the grains were in the shape of a rectangular parallelepiped and the average length of the respective sides was approximately 5 to 20 μm. A surface of the rectangular parallelepiped was in parallel to the (100) surface of NN. The aspect ratio of the grains in the shape of a rectangular parallelepiped (L$_{max}$/L$_{min}$) was 3 or less, where L$_{min}$ was the minimum length and L$_{max}$ was the maximum length of the sides of the grains in the shape of a rectangular parallelepiped.

From the ICP analysis, the molar ratio of Na/Nb of the NN powder formed under various conditions was more than 1 and less than 1.05. On average, the ratio of Na/Nb was 1.03.

Then, the above-mentioned NN grains in the shape of a rectangular parallelepiped was used to form plate-like NN grains. The NN grains in the shape of a rectangular parallelepiped were dispersed in ethanol containing 4.5 wt % of PVB (BL-1, manufactured by SEKISUI CHEMICAL CO., LTD.). The solution was dropped onto a glass plate. By tilting the glass plate, the NN grains in the shape of a rectangular parallelepiped were spread on the glass substrate. After the NN grains in the shape of a rectangular parallelepiped were spread, the glass plate was returned to the horizontal state and was left as it is. When the alcohol evaporated, a film containing the NN grains in the shape of a rectangular parallelepiped was obtained. Evaluation was made by X-ray diffraction of the crystallographic orientation. It was found that the NN grains were (100) oriented. The film containing the NN grains in the shape of a rectangular parallelepiped was removed from the glass plate, crushed, and sifted through a sieve of 75 μm to obtain the plate-like NN grains. Plate-like NN grains having the aspect ratio of the thickness and the largest width which is orthogonal to the thickness (width/thickness) that was 3 or more could be formed.

The above-mentioned plate-like NN grains were mixed with barium titanate grains (BT01 manufactured by Sakai Chemical Industry Co., Ltd.). The mole fractions of the plate-like NN grains and the barium titanate grains were 88:12. The above-mentioned mixed powder was filled in a mold for press forming. When the mixed powder was filled, the mold for press forming was tapped with a hand. After that, the mixed powder was uniaxially pressurized at 200 MPa to form a disc-like compact having a diameter of 10 mm and a thickness of 1 to 2 mm. The compact was held at 600° C. for 3 hours in the air to remove the binder, and then, heating to 1,260° C. was carried out and the state was held for 6 hours to obtain a sintered body.

The sintered body was ground, and the constituent phase and the crystallographic orientation of the sintered body were evaluated by X-ray diffraction. It was found that the obtained sample was a single-phase solid solution of sodium niobate and barium titanate and was (100) oriented in a pseudocubic system. The Lotgering factor indicating the degree of (100) orientation was 30 to 50%.

Through a procedure similar to that of Comparative Example 1, the sample was caused to have a thickness of 500 μm and electrodes were formed. After polarization treatment, the piezoelectricity was evaluated. The piezoelectric constant $d_{31}$ was 50 pC/N or more. Through measurement of the dependence of permittivity on temperature with application of an alternating electric field having a frequency of 1 kHz to 100 kHz and an amplitude of 500 mV, the Curie temperature was evaluated. The Curie temperature was 190 to 210° C., which was higher than the Curie temperature of barium titanate (about 130° C.).

Figure 6B:
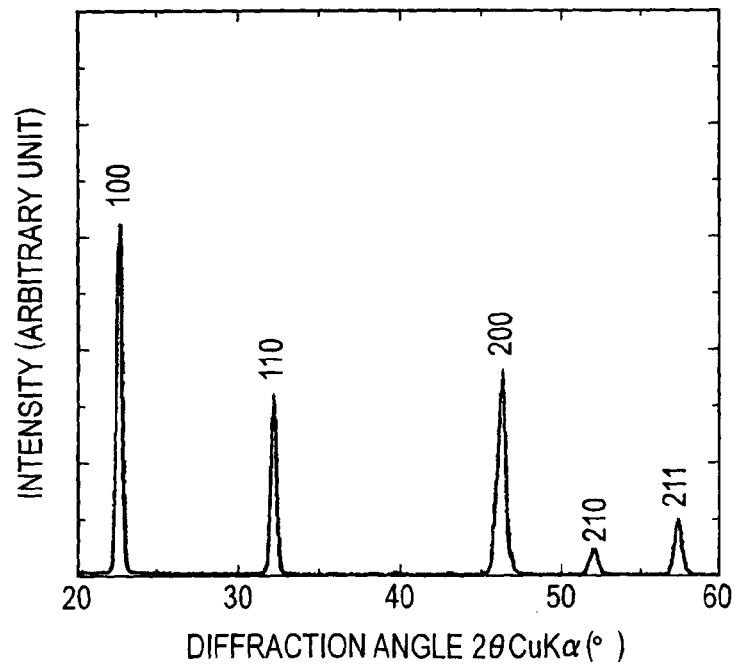

FIG. 6B shows an X-ray diffraction pattern of the oriented ceramic formed using the above-mentioned plate-like NN grains. Compared with the X-ray diffraction pattern of the non-oriented ceramic formed by the solid state reaction of Comparative Example 1, in the diffraction pattern of the oriented piezoelectric ceramic formed in this example, the diffraction intensities of 100 and 200 were large, which indicates that the piezoelectric ceramic had (100) orientation.

Examples 2 to 7

Through a procedure similar to that of Example 1, NN grains in the shape of a rectangular parallelepiped having an average length of the respective sides of 5 to 20 μm were formed. The NN grains in the shape of a rectangular parallelepiped, NN grains of indefinite shape formed by the solid state reaction or the like, barium titanate grains (BT01 manufactured by Sakai Chemical Industry Co., Ltd.), copper oxide (general formula: CuO), and a mixed solvent of toluene and ethanol were added in a container to form slurry. The mole fractions of the NN grains and the barium titanate grains were any one of 90:10, 88:12, and 85:15, and the molar ratio of CuO to NN (CuO/NaNbO$_3$) was between 0 and 0.02. 20 to 80% of NN was the rectangular parallelepiped NN grains. As the remaining NN, the NN grains of indefinite shape having a grain size of about 200 nm were used. The weight ratio between toluene and ethanol was 53:47, and the amount of the solvent was 1.6 to 1.7 times as much as that of the powder. In the mixing, in order not to crash the NN grains in the shape of a rectangular parallelepiped, a stirring deaerator (also called a rotation/revolution mixer) was used. After that, a binder and a plasticizer were added. As the binder, PVB (BH-3 manufactured by SEKISUI CHEMICAL CO., LTD.) was used. The weight of PVB was 0.07 times as much as that of the grains in the slurry. As the plasticizer, dibutyl phthalate in equal proportion to that of the binder was added. Mixing by the above-mentioned method was carried out again. The amounts of the solvent and the binder were adjusted so that the viscosity of the slurry was approximately 200 to 500 mPa·s.

The obtained slurry and a doctor blade device with a changeable gap width in a range of 25 to 250 μm were used to form a green sheet containing the rectangular parallelepiped NN grains. The size of the gap was about twice as much as the average length of the respective sides of the used NN grains in the shape of a rectangular parallelepiped. After the sheet was formed, the green sheet was dried. The green sheets were brought into contact with one another under pressure so that the thickness of the sample was 500 to 1,000 μm. The bringing into contact under pressure was carried out by stacking multiple green sheets and applying uniaxial pressure at 30 MPa in the direction of the stack at 80° C. for 10 minutes. The obtained stack was sintered at 1,200 to 1,260° C. for 6 hours in the air. The obtained sintered body was a solid solution of NN—BT having a (100) preferred orientation in a pseudocubic system. Through a procedure similar to that of Comparative Example 1, the sample was caused to have a thickness of 500 μm, electrodes were formed, and a piezoelectric element was formed. Table 1 shows the composition and the characteristics of the samples.

Compared with the piezoelectric constant of the sample of Comparative Example 1, the oriented piezoelectric ceramics of the present invention exhibited larger piezoelectric constants. Further, comparison between samples with the same molar ratio of NN to barium titanate revealed that the samples of Examples 3 to 5 to which copper was added exhibited larger piezoelectric constants than those of the samples of Examples 1 and 2 to which copper was not added. Further, the resistivities of the samples to which copper was not added were 1 to 20 GΩ·cm, and the resistivities of the samples to which copper was added were 20 GΩ·cm or more. Each of the concentrations of lead and potassium in the samples of the examples was equal to 1,000 ppm or less.

Through measurement of the dependence of permittivity on temperature with application of an alternating electric field having a frequency of 1 kHz to 100 kHz and an amplitude of 500 mV, the Curie temperature was evaluated. The Curie temperature was lowered as the ratio of barium titanate increased. However, the Curie temperature was at least equal to or higher than 150° C., which was higher than the Curie temperature of barium titanate (about 130° C.)

TABLE 1

|  | Molar ratio (NaNbO$_3$:BaTiO$_3$) | Molar ratio (CuO/NaNbO$_3$) | Degree of (100) orientation Lotgering factor | Curie temperature (° C.) | Piezoelectric constant $d_{31}$ (pC/N) |
| --- | --- | --- | --- | --- | --- |
| Comparative Example 1 | 88:12 | 0 | 0 | 190 to 210 | 40 to 50 |
| Example 1 | 88:12 | 0 | 30 to 50 | 190 to 210 | 50 to 55 |
| Example 2 | 88:12 | 0 | 50 to 60 | 190 to 210 | 50 to 60 |

TABLE 1-continued

| | Molar ratio (NaNbO$_3$:BaTiO$_3$) | Molar ratio (CuO/NaNbO$_3$) | Degree of (100) orientation Lotgering factor | Curie temperature (° C.) | Piezoelectric constant d$_{31}$ (pC/N) |
|---|---|---|---|---|---|
| Example 3 | 88:12 | 0.0005 | 40 to 70 | 190 to 210 | 60 to 70 |
| Example 4 | 88:12 | 0.005 | 40 to 70 | 190 to 210 | 60 to 70 |
| Example 5 | 88:12 | 0.02 | 40 to 70 | 190 to 210 | 60 to 70 |
| Example 6 | 90:12 | 0.005 | 40 to 70 | 210 to 240 | 50 to 60 |
| Example 7 | 85:12 | 0.005 | 40 to 70 | 160 to 190 | 50 to 65 |

Example 8

Through the use of the piezoelectric materials of Examples 2 and 3, a liquid discharge head illustrated in FIGS. 1A and 1B was produced. Ink discharge in response to input electric signals was confirmed.

Example 9

Through the use of the piezoelectric materials of Examples 2 and 3, an ultrasonic motor illustrated in FIGS. 2A and 2B was produced. Satisfactory rotation of the motor in response to application of an alternating voltage was confirmed.

Example 10

Through the use of the piezoelectric materials of Examples 2 and 3, a dust removing device illustrated in FIGS. 3A and 3B was prepared. When an alternating voltage was applied after spraying plastic beads, satisfactory dust removal was confirmed.

INDUSTRIAL APPLICABILITY

The piezoelectric material according to the present invention exhibits satisfactory piezoelectricity even at high ambient temperature. The piezoelectric material does not contain lead, and thus, the environmental load thereof is low. Therefore, the lead-free piezoelectric material according to the present invention may be used without problems in devices such as a liquid discharge head, an ultrasonic motor, and a dust removing device which use a large amount of a piezoelectric material.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-121483, filed May 31, 2011, which is hereby incorporated by reference herein in its entirety.

REFERENCE SIGNS LIST 101 piezoelectric element
102 individual liquid chamber
103 diaphragm
104 liquid chamber partition wall
105 discharge port
106 communicating hole
107 common liquid chamber
108 buffer layer
1011 first electrode
1012 piezoelectric material
1013 second electrode
201 transducer
202 rotor
203 output axis
204 transducer
205 rotor
206 spring
2011 elastic ring
2012 piezoelectric element
2013 organic adhesive
2041 metal elastic body
2042 stacked piezoelectric element
310 dust removing device
320 diaphragm
330 piezoelectric element
331 piezoelectric material
332 first electrode
333 second electrode
336 first electrode surface
337 second electrode surface

The invention claimed is:

1. An oriented piezoelectric ceramic, comprising as a main component a metal oxide represented by the following general formula (1),
wherein the oriented piezoelectric ceramic has a lead content and a potassium content that are each 0 ppm or more and 1,000 ppm or less:
(1−x)NaNbO3-xBaTiO3 . . . general formula (1),
where a relationship of 0<x<0.3 is satisfied,
wherein the oriented piezoelectric ceramic is (100) oriented in a pseudocubic system, and
wherein the oriented piezoelectric ceramic has a degree of orientation expressed by a Lotgering factor that is 50% or more and 100% or less.

2. The oriented piezoelectric ceramic according to claim 1, further comprising 0.05 tool % or more and 2 tool % or less of copper with respect to 1 tool of the metal oxide.

3. A piezoelectric element, comprising: the oriented piezoelectric ceramic according to claim 1; and a pair of electrodes provided so as to be in contact with the oriented piezoelectric ceramic.

4. A liquid discharge head, comprising: a liquid chamber comprising a vibration portion including the piezoelectric element according to claim 3; and a discharge port communicating with the vibration body.

5. An ultrasonic motor, comprising: a vibration body including the piezoelectric element according to claim 3; and a moving body that is in contact with the vibration body.

6. A dust removing device comprising a vibration body including the piezoelectric element according to claim 3.

7. An oriented piezoelectric ceramic comprising as a main component a metal oxide represented by general formula (1):
(1−x)NaNbO3-xBaTiO3 . . . general formula (1),
where a relationship of 0<x<0.3 is satisfied, wherein the oriented piezoelectric ceramic has a lead content and a potassium content that are each 0 ppm or more and 1,000 ppm or less, and wherein the oriented piezoelectric ceramic is obtained by a process comprising:

performing hydrothermal synthesis using sodium hydroxide and an amorphous niobium oxide hydrate represented by $Nb_2O_5 * nH_2O$, where a relationship of $1<n<3$ is satisfied, as raw materials to provide sodium niobate;

providing a compact formed of the sodium niobate and barium titanate; and sintering the compact.

* * * * *